United States Patent
Noro et al.

(10) Patent No.: US 7,362,180 B2
(45) Date of Patent: Apr. 22, 2008

(54) PROTECTION CIRCUIT OF DIGITAL AMPLIFIER

(75) Inventors: Masao Noro, Hamamatsu (JP); Hajime Asahira, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 285 days.

(21) Appl. No.: 11/204,904

(22) Filed: Aug. 16, 2005

(65) Prior Publication Data

US 2007/0040611 A1    Feb. 22, 2007

(30) Foreign Application Priority Data

Aug. 17, 2004   (JP) .............................. 2004-237047

(51) Int. Cl.
  *H03F 1/52*   (2006.01)
  *H03F 3/217*  (2006.01)
(52) U.S. Cl. ...................... 330/298; 330/251
(58) Field of Classification Search ............ 330/207 P, 330/298
See application file for complete search history.

(56) References Cited

U.S. PATENT DOCUMENTS 4,173,739 A  *  11/1979  Yoshida ...................... 330/298
4,338,573 A  *  7/1982   van den Bungelaar
                         et al. ........................ 330/298

FOREIGN PATENT DOCUMENTS

JP          5-160649           6/1993

* cited by examiner

*Primary Examiner*—Steven J. Mottola
(74) *Attorney, Agent, or Firm*—Pillsbury Winthrop Shaw Pittman LLP

(57) ABSTRACT

A protection circuit of a digital amplifier includes a DC voltage detection circuit for detecting a DC voltage occurring in a loudspeaker output terminal; a control circuit for performing protection operation when the DC voltage detection circuit outputs a detection signal; and a midpoint potential detection circuit for detecting midpoint potential shift between a positive power supply voltage and a negative power supply voltage. Output of the midpoint potential detection circuit is connected to input of the DC voltage detection circuit and when the midpoint potential shift is detected, the DC voltage detection circuit outputs a detection signal.

5 Claims, 4 Drawing Sheets

PROTECTION CIRCUIT OF DIGITAL AMPLIFIER

BACKGROUND OF THE INVENTION

This invention relates to a digital amplifier and in particular to a protection circuit when output is short-circuited.

FIG. 2 is a circuit diagram to show a configuration example of a digital amplifier in a related art. In FIG. 2, T denotes a transformer, D3 and D4 denote rectification elements (diodes), and C1 and C2 denote smoothing capacitors. The transformer T, the rectification elements D3 and D4, and the smoothing capacitors C1 and C2 make up a positive-negative power supply of capacitor input type. On the other hand, in a digital amplifier section, SS1 and SW2 denote switching transistors such as MOSFETs driven by output of a PWM modulation circuit (not shown), D1 and D2 denote diodes (flywheel diodes) connected to the switching transistors SS1 and SW2 in parallel, LF denotes a coil, CF codes a capacitor, RL denotes a load (loudspeaker), and SPOUT denotes a loudspeaker output terminal.

In the digital amplifier in FIG. 2, the switching transistors SS1 and SW2 are driven complementarily by a signal provided by performing PWM modulation of an input signal, and the load RL is driven through a low-pass filter made up of the coil LF and the capacitor CF. That is, as the switching transistor SS1 is brought into conduction (the switching transistor SW2 is brought out of conduction), current I+ flows from the positive power supply and as the switching transistor SW2 is brought into conduction (the switching transistor SS1 is brought out of conduction), current I− flows into the negative power supply, whereby the load RL is driven, as shown in FIG. 2. Such a digital amplifier is known as a very highly efficient amplifier.

By the way, an amplifier is provided with a protection circuit to protect a product against an abnormal state of a short circuit of loudspeaker output. Generally, a protection circuit of a digital amplifier is made up of an overcurrent detection circuit LDT on the negative power supply side (which will be hereinafter called low side) and an overcurrent detection circuit HDT on the positive power supply side (which will be hereinafter called high side), as shown in FIG. 3. The overcurrent detection circuit LDT is made up of resistors R1 and R2 and an npn transistor Q1 for detecting an overcurrent when loudspeaker output is short-circuited by observing the voltage of the resistor R1 inserted into the switching transistor SW2 on the low side in series and turning on the transistor Q1 at the overcurrent detection time. Likewise, the overcurrent detection circuit HDT is made up of resistors R3 to R5 and a pnp transistor Q2 for observing the voltage of the resistor R3 inserted into the switching transistor SS1 on the high side in series and turning on the transistor Q2 at the overcurrent detection time, thereby turning on the transistor Q1. When the transistor Q1 is turned on, a control circuit (not shown) performs the protection operation of stopping the switching operation, turning off the power, etc.

However, the protection circuit as in FIG. 3 needs to detect a current at one instantaneous large output time in a normal state as a non-overcurrent; on the other hand, when an overcurrent is caused by a short circuit of loudspeaker output, the protection circuit is required to promptly detect the overcurrent. Thus, it is difficult to set the operation point; this is a problem.

In the half-bridge digital amplifier as in FIG. 2 or FIG. 3, it is known that a power pumping phenomenon in which the voltages of the positive and negative power supplies is placed out of balance is known. The power pumping phenomenon will be discussed with FIG. 4. FIG. 4 is a drawing to show the voltages and currents of the parts when positive voltage VRL is supplied to the load RL in the digital amplifier in FIG. 2.

As shown in (A) of FIG. 4, when the positive voltage VRL is applied to the load RL, time period T1 during which the switching transistor SS1 conducts becomes longer than time period T2 during which the switching transistor SW2 conducts. In the time period T1 from time t1 to time t2, a current I1 flows on a path from the positive power supply to the switching transistor SW1, the coil LF, the load RL, and ground ((C) of FIG. 4). Next, at time t2, the switching transistor SW1 is brought out of conduction and the switching transistor SW2 conducts. Accordingly, voltage Vo at the connection point of the switching transistors SS1 and SW2 changes from +V to −V. On the other hand, since the coil LF of an inductive load exists, the current changes with a delay from the change in the voltage and flows in the opposite direction to the direction of the voltage for one time. That is, a current I2 continues to flow through a path of the diode D2, the coil LF, the load RL, the capacitor C2 ((D) of FIG. 4). Since the switching frequency of the PWM modulation circuit for driving the switching transistor SW1, SW2 is a very high frequency of several hundred kHz, for example, time t3 is reached before current I− flows into the negative power supply through the switching transistor SW2, and the switching transistor SS1 is brought into conduction and the switching transistor SW2 is brought out of conduction and again the current I1 flows. Thus, load current IL shown in (B) of FIG. 4 flows into the load RL.

The direction of the current I2 is opposite to the direction of the current I− which should essentially flow at the conduction time of the switching transistor SW2, and the capacitor C2 on the low side is charged. Thus, voltage V2 charging the capacitor C2 becomes higher than voltage V1 across the capacitor C1 on the high side (V2>V1).

In contrast, when a negative voltage is applied to the load RL, the operation opposite to that described above is performed; the voltage V1 charging the capacitor C1 on the high side becomes higher than the voltage V2 across the capacitor C2 on the low side (V1>V2).

As the power pumping phenomenon as described above occurs, the voltages of the positive and negative power supplies is placed out of balance and the operation efficiency is degraded and there is a possibility that the amplifier may be destroyed due to overvoltage. The power pumping phenomenon becomes a more noticeable problem when loudspeaker output is short-circuited. In the digital amplifier in the related art, if the protection circuit shown in FIG. 3 operates, the overcurrent caused by short-circuiting of the loudspeaker output can be detected and consequently the power pumping phenomenon can be prevented from destroying the amplifier. However, it is difficult to set the operation point of the protection circuit as described above and it may be impossible to promptly find occurrence of an overcurrent and consequently there is a possibility that the amplifier may be destroyed due to the overvoltage caused by the power pumping phenomenon.

On the other hand, as another example of the protection circuit, a protection circuit having a current detection coil provided for a low-pass filter of loudspeaker output for detecting an overcurrent flowing into the coil of the low-pass filter is proposed. (For example, refer to JP-A-5-160649) FIG. 5 is a circuit diagram to show the configuration of the protection circuit disclosed in JP-A-5-160649. Components similar to those previously described with reference to FIG.

2 are denoted by the same reference numerals in FIG. 5. The protection circuit is made up of a current detection coil 1, a rectifier 2 an attenuator 3, a capacitor 4, and an R/S latch circuit 5. The current detection coil 1 wound around coil LF of low-pass filter detects a current flowing through the coil LF by mutual induction action and outputs the detected current as a detection signal. The detection signal is half-wave or full-wave rectified by the rectifier 2 and then the level is attenuated by the attenuator 3. If the level of the input detection signal becomes a predetermined value or more, the R/S latch circuit 5 outputs a latch signal indicating occurrence of an overcurrent. Thus, the protection circuit detects an overcurrent when loudspeaker output is short-circuited.

However, the protection circuit in FIG. 5 involves problems of complicated configuration and high cost. To detect the current flowing through the coil LF of the low-pass filter using the current detection coil 1 with good accuracy, it is desirable that the voltage across the coil LF should be increased, and the resistance component of the coil LF needs to be made large. However, making large the resistance component inserted in series with the load RL is undesirable from the viewpoint of driving the load RL (loudspeaker). Thus, in the protection circuit in FIG. 5, the accuracy of current detection cannot be enhanced and it may be impossible to promptly find occurrence of an overcurrent and there is a possibility that the amplifier may be destroyed due to the overvoltage caused by a power pumping phenomenon.

The applicant has not found any related art documents relevant to the invention before the application time except the related art document determined in the related art document information described in the specification.

As described above, in the protection circuits shown in FIGS. 3 and 5, there is a possibility that occurrence of an overcurrent caused by short-circuiting of loudspeaker output cannot promptly be detected, and there is a possibility that the amplifier may be destroyed due to a power pumping phenomenon which becomes noticeable as loudspeaker output is short-circuited.

SUMMARY OF THE INVENTION

It is therefore an object of the invention to provide a protection circuit of a digital amplifier capable of reliably detecting short circuit of loudspeaker output and preventing a power pumping phenomenon from destroying the amplifier.

According to the invention, there is provided a protection circuit of a digital amplifier, including a DC voltage detection circuit for detecting a DC voltage occurring in a loudspeaker output terminal; a control circuit for performing protection operation when the DC voltage detection circuit outputs a detection signal; and a midpoint potential detection circuit for detecting midpoint potential shift between a positive power supply voltage and a negative power supply voltage, wherein output of the midpoint potential detection circuit is connected to input of the DC voltage detection circuit and when the midpoint potential shift is detected, the DC voltage detection circuit outputs a detection signal.

In one configuration example of the protection circuit of the digital amplifier of the invention, the midpoint potential detection circuit is made up of a first resistor having one terminal to which the positive power supply voltage is input and a second resistor having one terminal to which the negative power supply voltage is input and an opposite terminal connected to an opposite terminal of the first resistor, and the connection point of the first and second registers is connected to the input of the DC voltage detection circuit.

According to the invention, the midpoint potential detection circuit for detecting midpoint potential shift between the positive power supply voltage and the negative power supply voltage is provided and the output of the midpoint potential detection circuit is connected to the input of the DC voltage detection circuit, whereby short circuit of loudspeaker output can be detected reliably and a power pumping phenomenon can be prevented from destroying the amplifier. The components such as the DC voltage detection circuit DCDT and the control circuit CTL are provided for the digital amplifiers in the related arts and therefore the protection circuit from short circuit of loudspeaker output can be implemented simply by adding the midpoint potential detection circuit of the simple configuration. The need for providing both the overcurrent detection circuit on the high side and the overcurrent detection circuit on the low side is eliminated and only either may be provided, so that the configuration for protecting against an overcurrent can be simplified for reducing the cost.

DETAILED DESCRIPTION OF PREFERRED EMBODIMENTS

Figure 1:
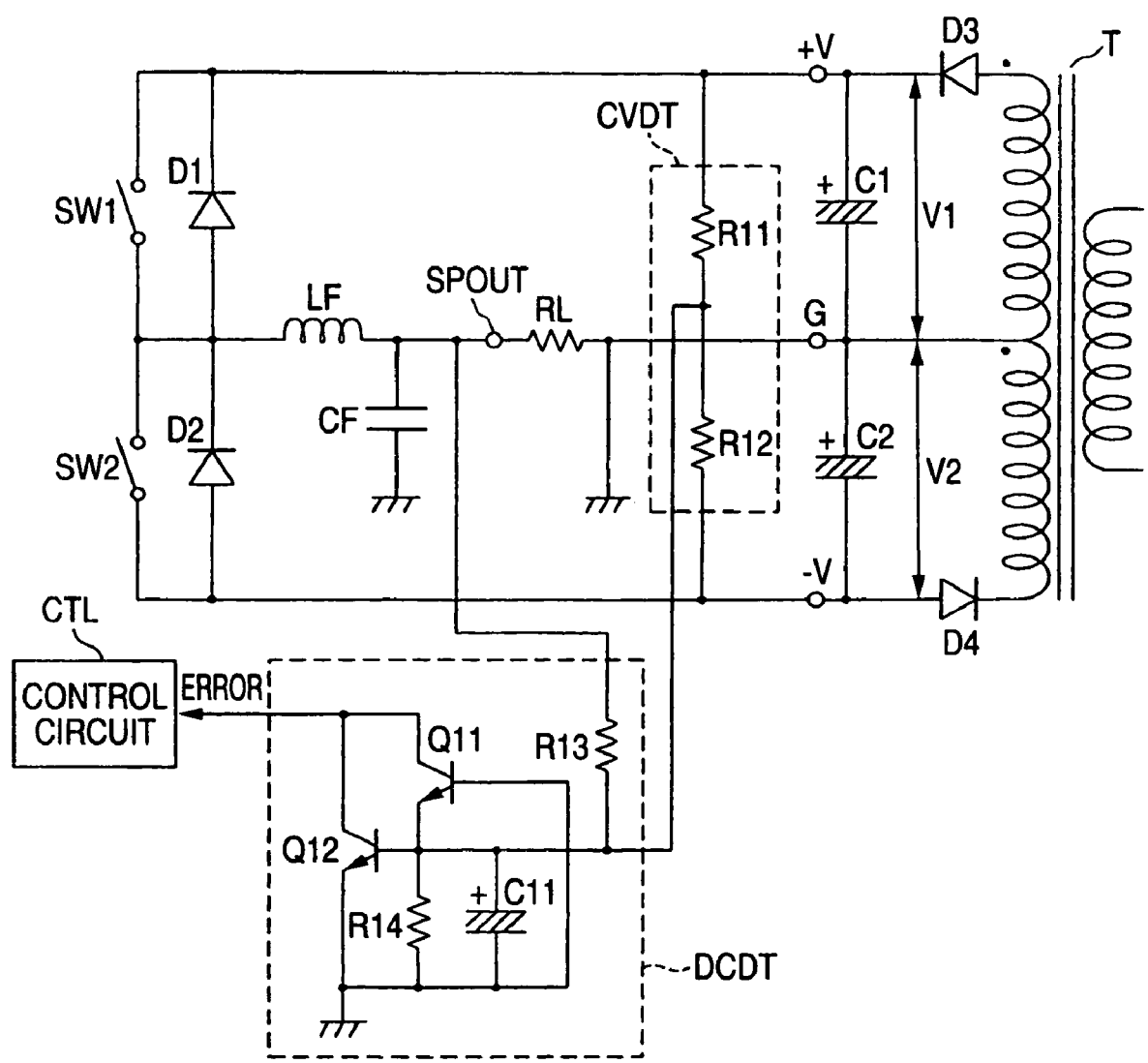
FIG. 1 is a circuit diagram to show a configuration example of a digital amplifier according to an embodiment of the invention.
Figure 2:
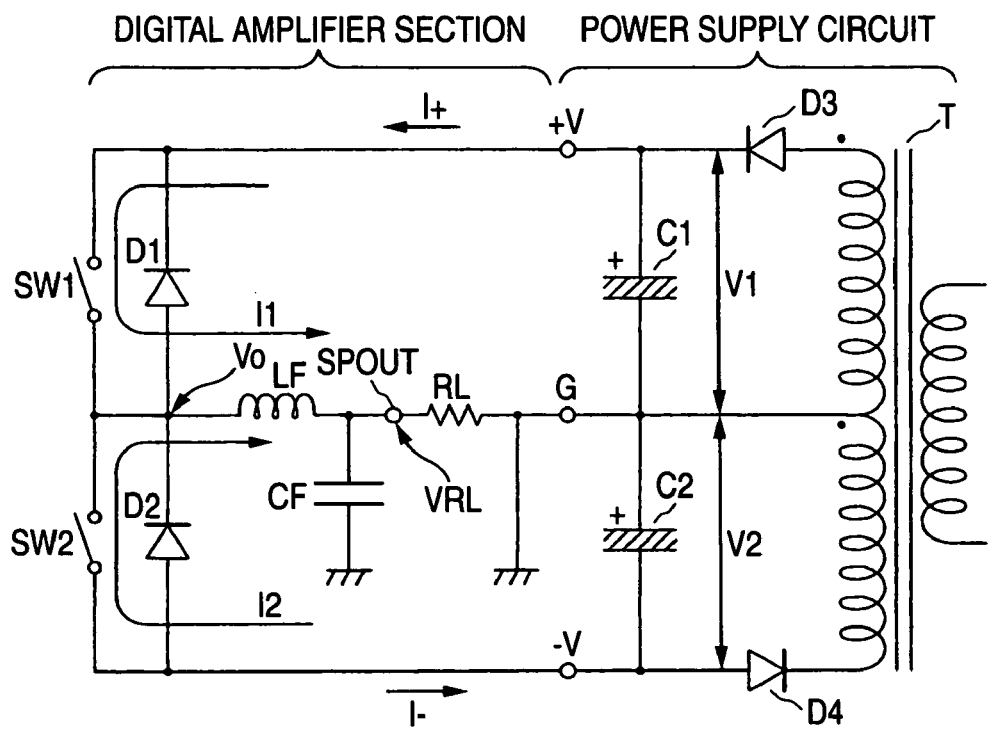
FIG. 2 is a circuit diagram to show a configuration example of a digital amplifier in a related art.

An embodiment of the invention will be discussed in detail with reference to the accompanying drawing. FIG. 1 is a circuit diagram to show a configuration example of a digital amplifier according to the embodiment of the invention. Components identical with those previously described with reference to FIG. 2 are denoted by the same reference numerals in FIG. 1. A transformer T, a diode D3, and a smoothing capacitor C1 make up a positive power supply for outputting a positive power supply voltage +V, and the transformer T, a diode D4, and a smoothing capacitor C2 make up a negative power supply for outputting a negative power supply voltage −V. In the digital amplifier in FIG. 1, switching transistors SW1 and SW2 are driven complementarily by a PWM modulation circuit (not shown) based on an input audio signal, and a load RL is driven through a low-pass filter made up of a coil LF and a capacitor CF.

In the embodiment, a midpoint potential detection circuit CVDT for detecting midpoint potential shift between the positive power supply voltage +V and the negative power supply voltage −V is added to the digital amplifier in the related art shown in FIG. 2 and output of the midpoint potential detection circuit CVDT is connected to input of a DC voltage detection circuit DCDT included in the digital amplifier in the related art and when midpoint potential shift is detected, the DC voltage detection circuit DCDT outputs a detection signal.

The DC voltage detection circuit DCDT detects DC voltage output inappropriate for a loudspeaker and is made up of resistors R13 and R14, a capacitor C11, and npn transistors Q11 and Q12. When a DC voltage of a predetermined value or more occurs in a loudspeaker output terminal SPOUT, the transistor Q11 or Q12 of the DC voltage detection circuit DCDT is turned on, outputting a detection signal Error.

The midpoint potential detection circuit CVDT is made up of resistors R11 and R12. When a power pumping phenomenon does not occur, the positive power supply voltage +V and the negative power supply voltage −V are equal (V1=V2) and the midpoint potential of the voltages +V and −V is zero (ground potential). In contrast, when a power pumping phenomenon occurs, the voltages +V and −V are placed out of balance (V1≠V2) and the midpoint potential shifts to either the positive or negative side. The midpoint potential detection circuit CVDT detects the midpoint potential shift. An output terminal of the midpoint potential detection circuit CVDT (connection point of the resistors R11 and R12) is connected to the input terminal of the DC voltage detection circuit DCDT, whereby the transistor Q11 or Q12 of the DC voltage detection circuit DCDT can be turned on if the midpoint potential shift is equal to or more than a predetermined value.

Thus, in the embodiment, attention is focused on the fact that when loudspeaker output is short-circuited, the overvoltage caused by a power pumping phenomenon becomes noticeable. A power pumping phenomenon is detected based on midpoint potential shift between the positive power supply voltage +V and the negative power supply voltage −V and accordingly short circuit of loudspeaker output is detected. If the transistor Q11 or Q12 of the DC voltage detection circuit DCDT is turned on and a detection signal Error occurs, a control circuit CTL performs protection operation in such a manner that it controls a relay (not shown) for turning on/off power of the digital amplifier for turning off the power of the amplifier or controls the PWM modulation circuit for stopping the switching operation of the switching transistor SW1, SW2, for example.

When loudspeaker output is short-circuited, overvoltage caused by a power pumping phenomenon appears clearly, so that short circuit of loudspeaker output can be detected reliably and the power pumping phenomenon can be prevented from destroying the amplifier. The power pumping phenomenon becomes a problem not only when loudspeaker output is short-circuited, but also when a low frequency is output, etc., for example. In the embodiment, however, the power pumping phenomenon can be detected and destroying the amplifier can be prevented regardless of the occurrence cause of the power pumping phenomenon, needless to say.

The components such as the DC voltage detection circuit DCDT, the control circuit CTL, the relay for turning on/off the power, and the PWM modulation circuit are provided for the digital amplifiers in the related arts and therefore the protection circuit from short circuit of loudspeaker output can be implemented simply by adding the resistors R11 and R12.

Figure 3:
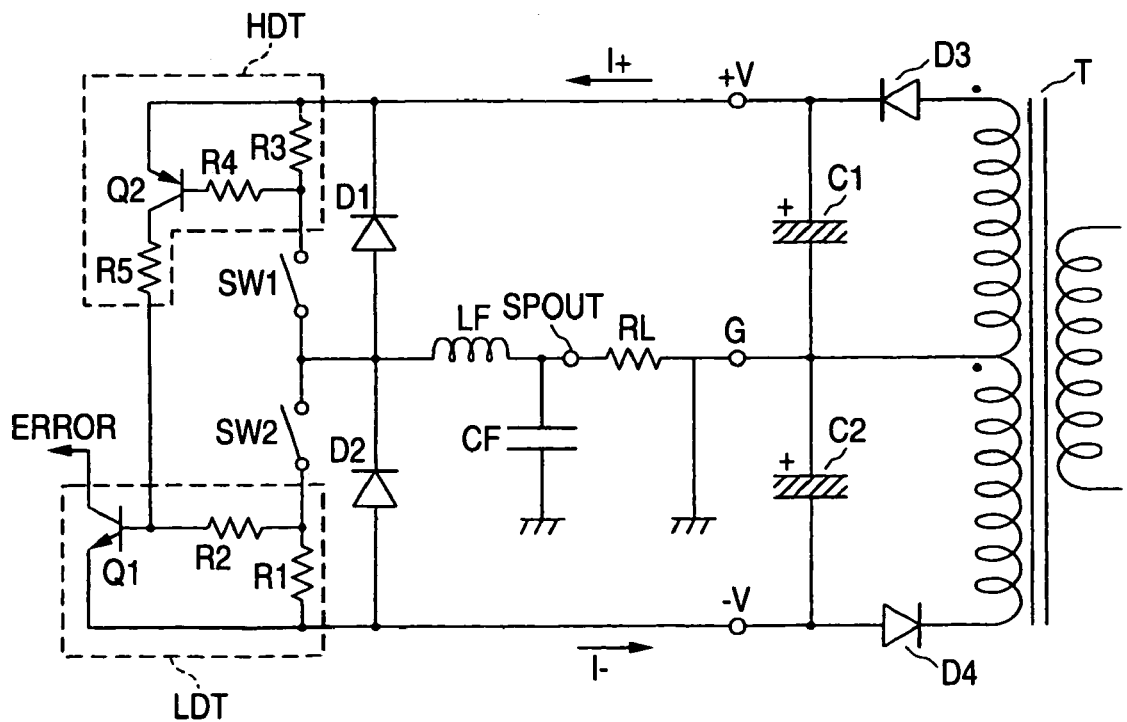
FIG. 3 is a circuit diagram to show a configuration example of a digital amplifier including a protection circuit in a related art.
Figure 4:
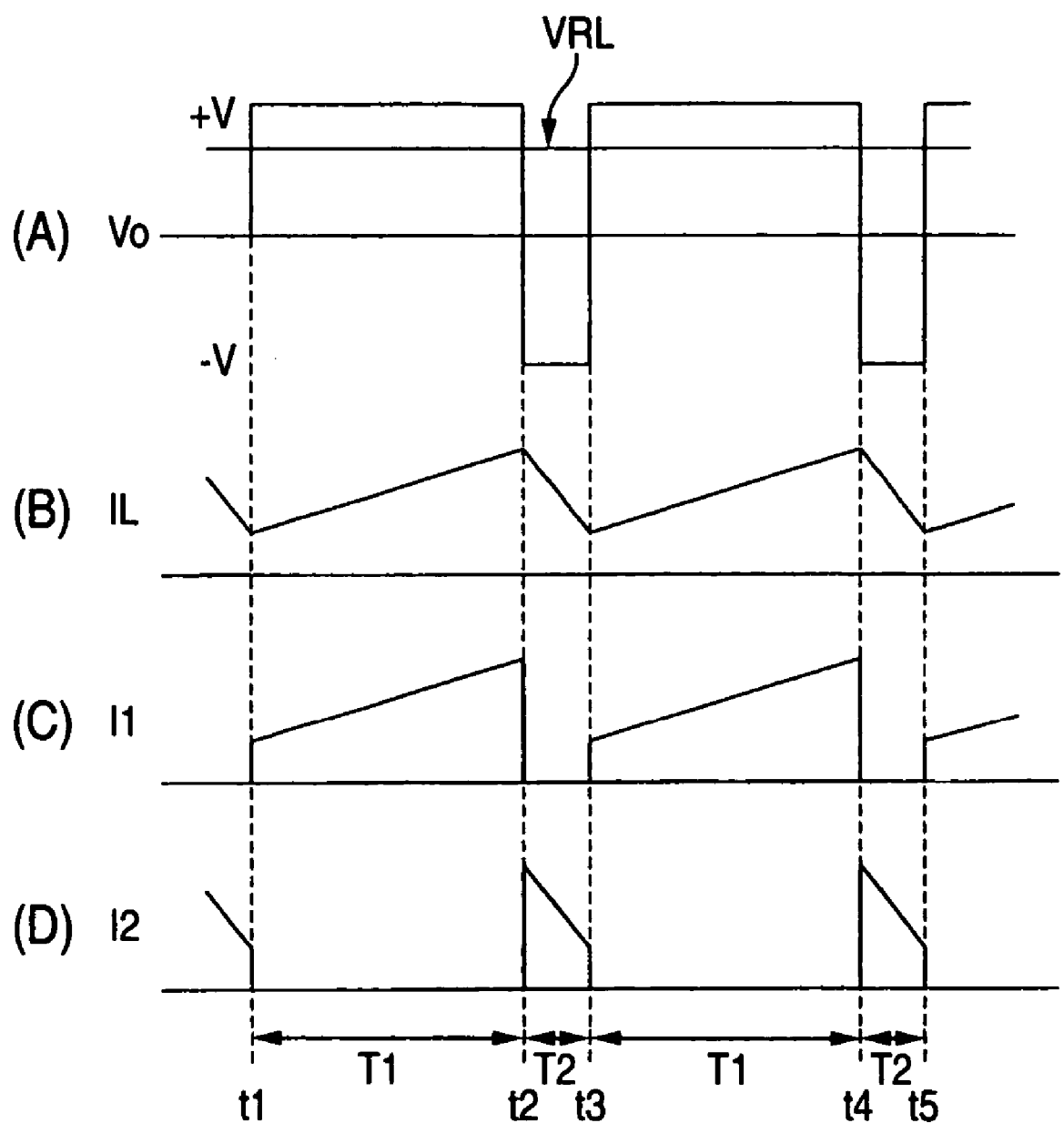
FIG. 4 is a drawing to describe a power bumping phenomenon in the digital amplifier in the related art.
Figure 5:
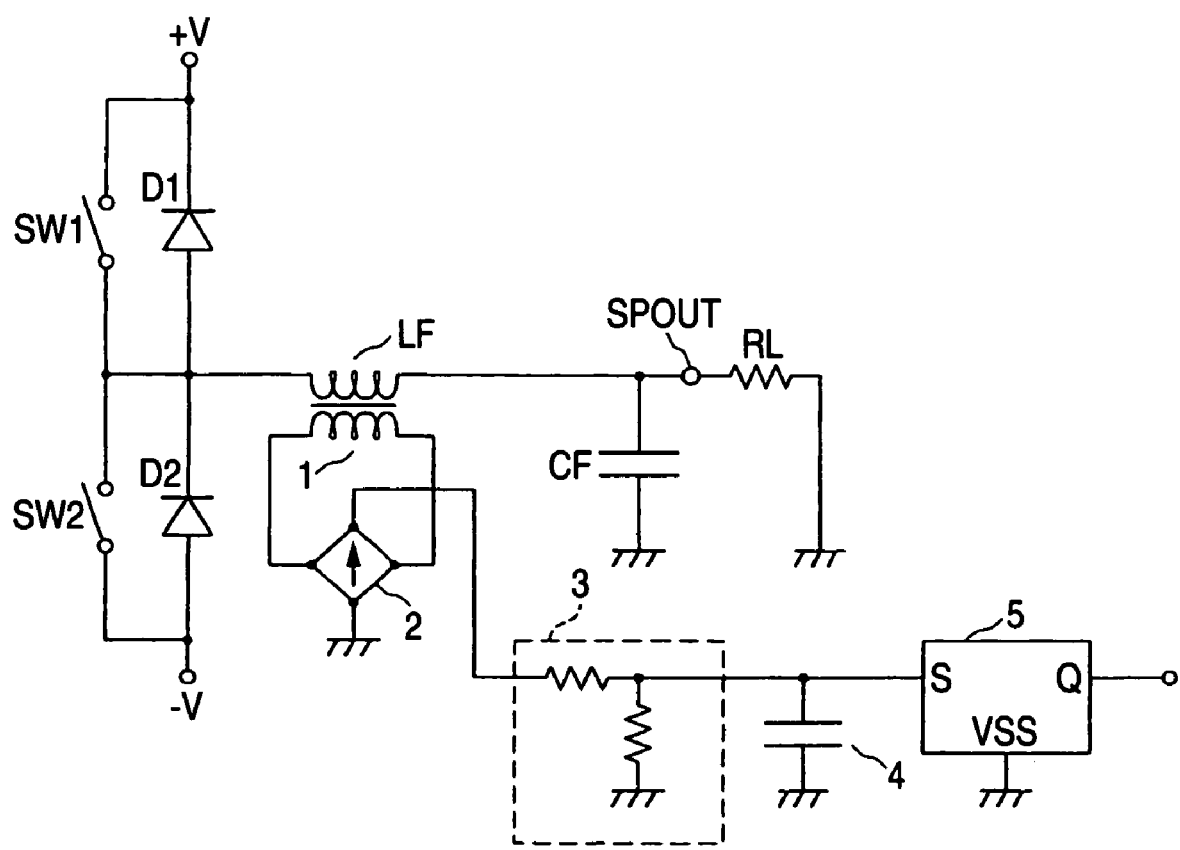
FIG. 5 is a circuit diagram to show another configuration example of a digital amplifier including a protection circuit in a related art.

In the protection circuit in the related art shown in FIG. 3, when an overcurrent is detected only on either the high or low side, if the detected current becomes the opposite direction because of a power pumping phenomenon (I2 in FIG. 4), an anomaly cannot be detected. Therefore, in the configuration in FIG. 3, both the overcurrent detection circuits HDT and LDT need to be provided. In contrast, in the embodiment, the overcurrent detection circuit need not detect short circuit of loudspeaker output or a power pumping phenomenon and needs only to detect occurrence of an instantaneous overcurrent caused by any other factor. Thus, only either the overcurrent detection circuit HDT or LDT may be provided and the configuration for protecting against an overcurrent can be simplified for reducing the cost.

The operation point of the protection circuit of the embodiment can be easily set according to the values of the resistors R11, R12, and R14. Since the resistor R14 is an existing resistor, in fact the operation point is set according to the values of the resistors R11 and R12.

There is a possibility that switching noise, etc., may be superposed on the positive power supply voltage +V and the negative power supply voltage −V, and it is feared that the noise may cause the protection circuit of the embodiment to malfunction. However, the capacitor C11 provided in the DC voltage detection circuit DCDT can decrease the effect of noise, so that the protection circuit can be prevented from malfunctioning.

The invention can be applied to a half-bridge digital amplifier.

What is claimed is:

1. A protection circuit for a digital amplifier, the protection circuit comprising:
a DC voltage detection circuit that detects a DC voltage generated in a loudspeaker output terminal of the digital amplifier;
a control circuit that performs protection operation when the DC voltage detection circuit outputs a detection signal; and
a midpoint potential detection circuit that detects midpoint potential shift between a positive power supply voltage and a negative power supply voltage of the digital amplifier,
wherein an output of the midpoint potential detection circuit is connected to an input of the DC voltage detection circuit and when the midpoint potential shift is detected, the DC voltage detection circuit outputs a detection signal.

2. The protection circuit according to claim 1, wherein the midpoint potential detection circuit comprises a first resistor having one terminal to which the positive power supply voltage is input and a second resistor having one terminal to which the negative power supply voltage is input and an opposite terminal connected to an opposite terminal of the first resistor, and a connection point of the first and second registers is connected to the input of the DC voltage detection circuit.

3. The protection circuit according to claim 1, wherein an output of the digital amplifier is provided with a lower pass filter.

4. The protection circuit according to claim 1, wherein the protection operation includes at least one of stopping a switching operation of a switching transistor of the digital amplifier and turning off power of the digital amplifier.

5. The protection circuit according to claim 2, wherein the connection point is electrically separated from an input of the digital amplifier.

* * * * *